United States Patent [19]
Liang et al.

[11] Patent Number: 5,623,153
[45] Date of Patent: Apr. 22, 1997

[54] SUB-QUARTER MICROMETER CHANNEL FIELD EFFECT TRANSISTOR HAVING ELEVATED SOURCE/DRAIN AREAS AND LIGHTLY DOPED DRAINS

[75] Inventors: Mong-Song Liang; Charles C. Hsu, both of Hsin-chu, Taiwan

[73] Assignee: Taiwan Semiconductor Manufacturing Company, Ltd., Hsinchu, Taiwan

[21] Appl. No.: 663,435

[22] Filed: Jun. 13, 1996

Related U.S. Application Data

[62] Division of Ser. No. 416,167, Apr. 4, 1995, Pat. No. 5,545,579.

[51] Int. Cl.$^6$ ..................................... H01L 29/76
[52] U.S. Cl. .................. 257/336; 257/344; 257/346; 257/900
[58] Field of Search .................. 437/44, 45, 162; 257/336, 344, 346, 340, 900

[56] References Cited

U.S. PATENT DOCUMENTS

| | | | |
|---|---|---|---|
| 5,045,901 | 9/1991 | Komori et al. | 257/344 |
| 5,071,780 | 12/1991 | Tsai | 437/41 |
| 5,141,891 | 8/1992 | Arima et al. | 437/44 |
| 5,196,357 | 3/1993 | Boardman et al. | 437/40 |
| 5,270,232 | 12/1993 | Kimura et al. | 437/44 |
| 5,374,575 | 12/1994 | Kim et al. | 437/44 |
| 5,453,635 | 9/1995 | Hsu et al. | 257/344 |
| 5,472,897 | 12/1995 | Hsu et al. | 437/44 |
| 5,534,447 | 7/1996 | Hong | 437/44 |
| 5,538,913 | 7/1996 | Hong | 437/44 |

OTHER PUBLICATIONS

"A Sub–0.1 μm Grooved Gate MOSFET with High Immunity to Short–Channel Effects" by J. Tanaka et al, IEDM Proceedings of the IEEE, 1993, pp. 537–540, Month Unknown.

*Primary Examiner*—John Niebling
*Assistant Examiner*—Michael S. Lebentritt
*Attorney, Agent, or Firm*—George O. Saile

[57] ABSTRACT

A reverse self-aligned field effect transistor having sub-quarter micrometer (<0.25 um) channel lengths, lightly doped source/drain, and shallow junction depths was achieved. The method for fabricating the FET includes a doped pad oxide layer that functions as both an etch stop layer and a diffusion source for the lightly doped drain. The doped pad oxide prevents the substrate from being etched when a channel opening for the gate electrode is etched in a source/drain polysilicon layer. The sub-quarter micrometer channel length was achieved by reducing the channel opening by sidewall spacer techniques. The shallow source/drain junctions out diffused from the polysilicon are about 0.10 to 0.15 um depth, and the lightly doped source/drain. Junctions are about 0.05 to 0.08 um depth.

10 Claims, 5 Drawing Sheets

SUB-QUARTER MICROMETER CHANNEL FIELD EFFECT TRANSISTOR HAVING ELEVATED SOURCE/DRAIN AREAS AND LIGHTLY DOPED DRAINS

This application is a divisional application of U.S. application Ser. No. 08/416,167, filed Apr. 4, 1995, now U.S. Pat. No. 5,545,579.

RELATED PATENT APPLICATION

Ser. No. 08/416,168 filed Apr. 4, 1995 entitled A METHOD FOR FABRICATING CMOS FIELD EFFECT TRANSISTORS HAVING SUB-QUARTER MICROMETER CHANNEL LENGTHS WITH IMPROVED SHORT CHANNEL EFFECT CHARACTERISTICS

BACKGROUND OF THE INVENTION (1) Field of the Invention

The present invention relates to the fabrication of integrated circuit devices on semiconductor substrates, and more particularly relates to field effect transistors having sub-quarter micrometer channel lengths and lightly doped drains (LDD).

(2) Description of the Prior Art

Recent advances in the semiconductor process technologies in the past few years have dramatically decreased the device feature size and increased the circuit density and performance on integrated circuit chips. The device most used for Ultra Large Scale Integration (ULSI) is the Field Effect Transistor (FET), having a silicon gate electrode and self-aligned source/drain contact areas. The popular choice of FETs is because of their very small size, high packing density, low power consumption and high yields.

The conventional FETs are typically fabricated by patterning polysilicon gate electrodes over a thin gate oxide on a single crystal semiconductor substrate. The gate electrode structure is used as a diffusion or implant barrier mask to form self-aligned source/drain areas in the substrate adjacent to the sides of the gate electrode. The distance from the source junction to drain junction under the gate electrode is defined as the channel length of the FET.

Advances in semiconductor technologies, such as high resolution photolithographic techniques and anisotropic plasma etching, to name a few have reduced the minimum feature sizes on devices to less than a micrometer. For example, FETs are currently used in the industry having channel lengths that are less than a half micrometer (0.5 um) in length. If further increases in circuit density and device performance are to continue, then device minimum feature sizes and more specifically, the FET channel length must be reduced to sub-quarter micrometer dimensions (that is to less than 0.25 um).

However, as this down scaling continues and the channel length is further reduced in length, the FET device experiences a number of undesirable electrical characteristics known as short channel effects (SCE). These short channel effects become more severe as the device physical dimensions are scaled down. This result is due to the fact that the band gap and built in potential at junctions are a constant of crystalline material and non-scalable.

These adverse short channel effects result from the electric field distribution in the channel area when the integrated circuit is powered up, which lead to a number of problems. For example, electrons ejected from the drain can acquire sufficient energy to be injected into the gate oxide resulting in charge build up in the oxide that causes threshold voltage shifts. Unfortunately, this hot electron effect can degrade device performance after the product is in use (at the customer). Another adverse effect is the threshold voltage lowering referred to as threshold voltage roll-off. The decrease in threshold voltage ($V_{th}$) with reduced channel length occurs when the channel length is comparable to the source/drain junction depth.

To minimize the short channel effects, it is common practice in the semiconductor industry to fabricate FET structures with double diffused drains (DDD) or Lightly Doped Drains (LDD). These DDD of LDD FET structures, having low dopant concentration in the drains adjacent to the gate electrodes, modify the electric fields in the drain so as to minimize or eliminate the hot electron and roll-off effects. The short channel effect of threshold voltage roll-off can also be minimized by forming drains with shallow junction depths.

Another problem occurring with the conventional FETs, having patterned gate electrodes, is the limitations of the current photolithographic techniques to repeatedly and reliably produce sub-quarter micrometer (<0.25 um) wide gate electrode structures.

The reverse self-aligned field effect transistor process as been suggested as an alternative to conventional FETs for forming sub-micrometer gate electrode structures. For example, a method of forming one of these alternate FET structure is described by W. J. Boardman, et al U.S. Pat. No. 5,196,357. However, in this patent the thin gate oxide between the source/drain sidewalls and the gate electrode can result in a high gate to source/drain capacitance and reduced device performance. Other examples for making reverse self-aligned FETs is described by N. Tsai, U.S. Pat. No. 5,071780, and by H. Arima et al, U.S. Pat. No. 5,141,891. A related structure having a grooved channel region in the FET is described in a paper entitled "A Sub-0.1-um Grooved Gate MOSFET with High Immunity to Short-Channel Effects", by J. Tanaka et al, in the IEDM Proceedings of the IEEE, 1993 pages 537–540.

In these reverse self-aligned FET structures a multilayer usually having a polysilicon layer, as one of the layers is deposited over the device areas where the FETs are to be built. Openings having vertical sidewalls are etched in the multilayer at locations where the FET gate electrodes are to be formed. A gate oxide and sidewall insulating layers are formed in the opening and a second conducting layer is then deposited and patterned to form the self-aligned overlapping gate electrode. The patterned multilayer and out diffusion of dopant impurities therefrom an into the substrate serves as the source/drain areas of the FET. However, a number of problems still occur that make manufacturing these FETs difficult, such as etch control during patterning of layers and the ability to fabricate shallow source/drain junctions.

Therefore, there is still a strong need in the semiconductor industry for a more controllable and cost effective manufacturing process for forming reverse self-aligned field effect transistors having shallow lightly doped drains that are immunity from short channel effects.

SUMMARY OF THE INVENTION

It is therefore a principle object of this invention to describe a reverse self-aligned field effect transistors structure and a method of fabrication having sub-quarter micrometer channel lengths and shallow diffused source/drain regions and lightly doped drains (LDD).

It is another object of this invention to provide reverse self-aligned FET structures having a doped pad oxide layer to provide an etch stop layer for etching with good control a channel opening for a reverse self-aligned field effect transistor.

It is still another object of this invention to utilize the doped pad oxide layer as a diffusion source for forming shallow, lightly doped drain (LDD) junctions in the source/drain areas adjacent to the channel opening.

It is still another object of the invention to provide this FET structure by a simple and cost effective manufacturing process.

In accordance with the objects of this embodiment a method for fabricating improved reverse self-aligned field effect transistors (FETs) with lightly doped drains, shallow diffused junctions and sub-quarter micrometer channel lengths is described.

The method begins by providing a single crystal semiconductor substrate doped with a first conductive type dopant, such as a P-type dopant (boron), and a field oxide (FOX) that surrounds and electrically isolates device areas on and in which the FETs are built. A doped pad oxide layer, comprising of a silicate glass is deposited over the device and field oxide areas. The doped pad oxide layer is patterned, by photoresist masking and anisotropic etching, leaving a portion on the device areas while leaving other portions of the device area exposed for source/drain junction openings. The doped pad oxide portions also extend over portions of the field oxide on opposite sides of the device areas. A first polysilicon layer doped with a second conductive type dopant, such as an N-type dopant (arsenic or phosphorus) is deposited over the device areas and field oxide areas. A first insulating layer is deposited on the first polysilicon layer, and the first insulating layer and first polysilicon layer are patterned, leaving portions over the source/drain junction opening areas. Simultaneously, with the same patterning step, channel openings having vertical sidewalls are also formed in the first insulating and first polysilicon layers over the doped pad oxide layer. The channel openings separate the polysilicon layer into two portions over each device area, one portion over the source area and one over the drain area. The doped pad oxide serves as an etch stop layer so the polysilicon etch does not erode the underlying substrate in the channel opening area. The doped pad oxide is then selectively removed from the semiconductor substrate in the channel openings using a high selectivity oxide to silicon anisotropic plasma etch (e.g. in $CHF_3$). A conformal second insulating layer is then deposited on the first insulating layer and in the channel openings and blanket etched back to form insulating sidewall spacers in the opening. This extends the photolithography resolution by further reducing the channel width. A channel ion implantation is done in the openings using a dopant of the first conductive type (e.g. boron) as a channel implant. Additionally, at this step in the process, a second ion implant of the same conductive type (e.g. boron) can be carried out at higher implant energies to form an anti-punchthrough buried layer. Next a gate oxide is thermally grown on the substrate surface in the channel openings and the substrate further heated to out diffuse the second conductive type dopant (e.g. arsenic or phosphorus) in the first polysilicon layer into the substrate device areas to form diffused source/drain areas having shallow junctions. The lower concentration dopant in the doped pad oxide is also, during the same heat cycle, out diffused into the substrate adjacent to channel opening to form shallow lightly doped source/drains areas. A second polysilicon layer is then deposited and patterned leaving portions over the channel openings to form the overlapping gate electrodes. A third insulating layer is then deposited and contact opening are etched to the first polysilicon layer portions over the source/drain areas. A conducting layer, such as tungsten, aluminium or the like is deposited and patterned to provide the electrical con-tacts to the source and drains, and thereby complete the reverse self-aligned FET having sub-micrometer channel lengths and shallow source/drain areas in the substrate.

The examples given above for the first and second conductive type was for the fabrication of an N-channel FET. By reversing the conductive polarity of the first and second conductive type dopants, a P-channel FET can be fabricated in like fashion, and with additional photoresist masking and implant steps both P and N-channel FETs can be built on the same substrate for CMOS circuit applications.

BRIEF DESCRIPTION OF THE DRAWINGS

The object and other advantages of the invention will become more apparent in the preferred embodiment when read in conjunction with the following drawings.

DESCRIPTION OF THE PREFERRED EMBODIMENTS

Figure 1:
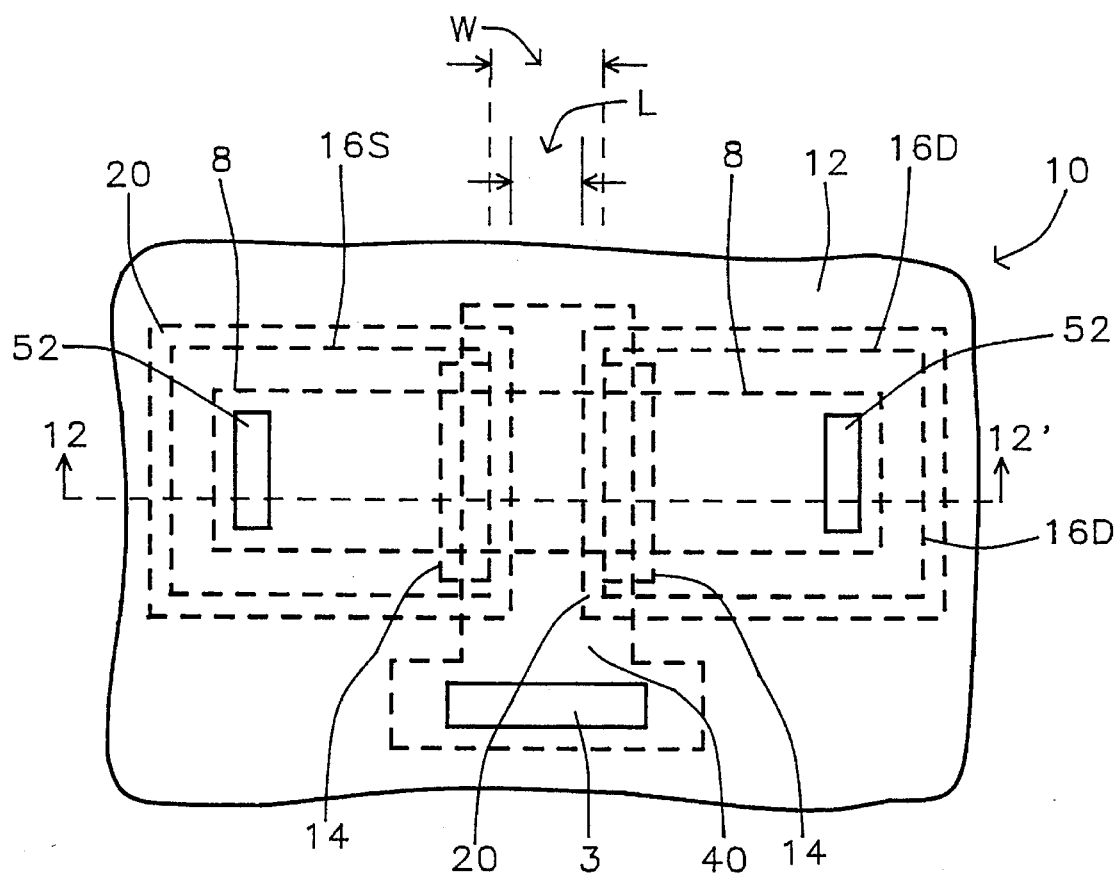
FIG. 1 shows a schematic elevational view of a portion of a substrate having a partially completed reverse self-aligned field effect transistor.

Referring first to the elevational view in FIG. 1, a brief description of the invention is given so as to better understand the more detail embodiment of the process with reference to FIGS. 2 through 12. Shown in FIG. 1, is a portion of a substrate 10 having a single FET device built thereon. The cross section 12–12' in FIG. 1 is for the finished FET device, shown in FIG. 12. The elevational view shows a field oxide 12 formed on the substrate surface 10 surrounding and electrically isolating a device area, the outer perimeter of the device area is indicated in FIG. 1 by the numeral 8. A doped pad oxide layer 14 is patterned over a center portion of the device area, the outer perimeter of which is labeled 14. A first polysilicon layer 16 having a first insulating layer (not shown) is patterned to form two portions, one over the source contact opening, labeled 16S, and one over the drain contact opening, labeled 16D on the exposed device area within 8. The patterned polysilicon layer 16 also overlaps the doped pad oxide layer 14, and forms a narrow channel opening having a width W over the pad oxide layer 14. This doped pad oxide 14 is later removed in the channel opening region after patterning the first polysilicon layer 16, but in this top view is already shown as removed. A sidewall spacer 20 is formed around the sidewalls of the first polysilicon portions 16. Most important to the invention, the sidewall spacers 20 are formed in the channel opening of width W to reduce the width to L, as indicated in FIG. 1. A gate oxide (not shown) is formed on the exposed substrate surface in the channel opening, and a second polysilicon layer 40 is patterned to form the gate electrode also labeled 40. A second insulating layer (not indicated in FIG. 1) is deposited over the gate electrode structure and contact openings 52 are etched in the second insulating over and to the source/drain first polysilicon areas 16S and 16D. A contact opening 3 is also etched to the gate electrode 40. A patterned conducting layer 54 shown in FIG. 12, but not shown in FIG. 1 to simplify the drawing is formed over the contact openings 52 to complete the invention.

Referring now to FIGS. 2 through 12 the preferred embodiment is shown for making this new reverse self-aligned field effect transistor (FET) having sub-quarter micrometer (<0.25 um) channel lengths and light doped drains. The process in described for making N-channel FETs, but it should be well understood by those skilled in the art that P-channel FETs can also be fabricated by reversing the conductive polarity, that is by reversing the dopant types and adjusting appropriately the dopant concentrations. It should also be understood that by including both N and P type well regions in the substrate and by including additional masking and implant steps, that both N and P-channel FETs can be fabricated simultaneously on the same substrate and that Complimentary MOS (CMOS) circuits can be formed therefrom.

Figure 2:
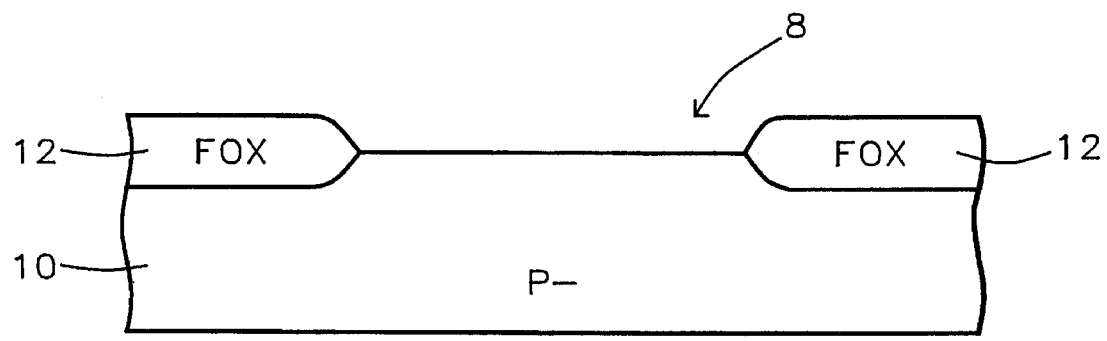
FIGS. 2 through 12, show schematically in cross sectional representation the preferred embodiment of the invention for fabrication N-channel reverse self-aligned field effect transistors.
Figure 3:
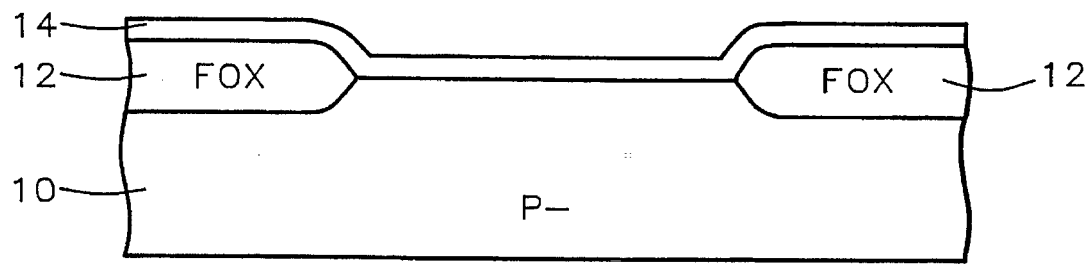

The process starts by first forming a Field OXide (FOX) region on the substrate separating and electrically isolating device areas whereon and in the reverse self-aligned FETs are to be built. Shown in FIG. 2, is a cross sectional view of a portion of a substrate 10 depicting one of the device area 8 surrounded by a field oxide structure 12. For the N-channel FET, the preferred substrate 10 is typically composed of a P-type doped single crystal silicon with a <100> crystallographic orientation. Alternatively, an N-type doped substrate can be used for making P-channel FETs, but for simplicity of presentation only the N-channel FET is described in this embodiment. The method commonly practiced in the semiconductor industry for forming the field oxide is referred to as the LOCal Oxidation of Silicon (LOCOS). It consists of using a thin thermal oxide (pad oxide) and a silicon nitride layer on the substrate surface as an oxidation resistant mask (not shown in the Fig.). The desired field oxide regions are etched open in the oxide/nitride layer using conventional photolithographic techniques and then the substrate is subjected to an oxidizing ambient to thermally grow the field oxide 12, as shown in FIG. 1. A typical thickness for the field oxide is between about 4000 to 6000 Angstroms.

The semiconductor devices are then fabricated on the silicon surface in the non-oxidize device areas 8, after removing the silicon nitride and pad oxide layer using a wet etch. For example, the silicon nitride can be removed in a solution of heated phosphoric acid ($H_3PO_4$) and the thin pad oxide in a dilute hydrofluoric acid solution. The reverse self-aligned FET of this invention having the sub-quarter micrometer channel lengths and the shallow source/drain junctions FET are now formed in the device areas.

Referring now to FIGS. 3 through 12, the method for fabricating the reverse self-aligned FET is described in detail. Starting with FIG. 3, a doped pad oxide 14 having a dopant of the first conductive type is deposited over the device areas and field oxide areas 12 formed on and in the substrate 10. The doped pad oxide layer is preferably composed of a phosphosilicate glass (PSG), sufficient doped so as to later form the lightly doped source/drain areas by out diffusion into the substrate 10. For example, the preferred percentage of phosphorus (P) in the silicate by weight is between about 1.0 to 3.0 weight percent (wt. %). The preferred deposition method of layer 14 is by plasma enhanced pressure chemical vapor deposition (PECVD) using, for example, a phosphine ($PH_3$) dopant gas during deposition to form the PSG, and the preferred thickness of the doped pad oxide layer 14 is between about 100 and 300 Angstroms.

Figure 4:
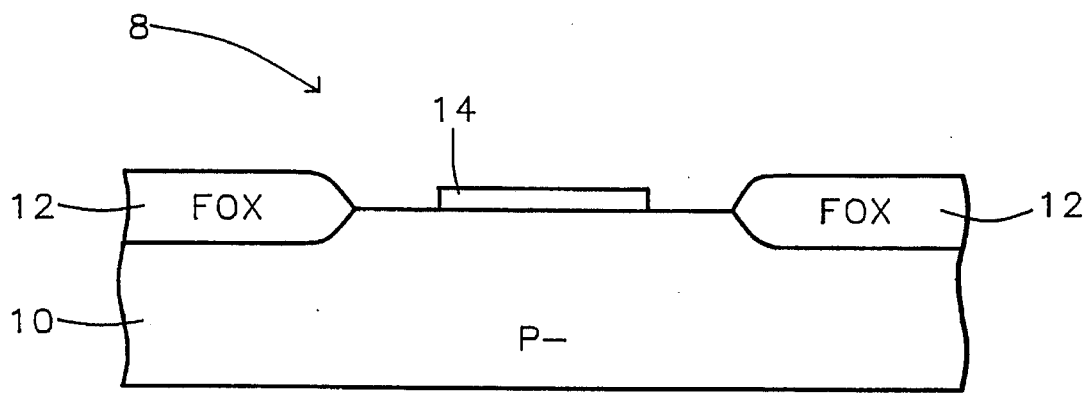

Referring now to FIG. 4, the pad oxide 14 is patterned by conventional photolithographic means and plasma etching and thereby forming a portion of layer 14 over the center region of the device area 8. A plasma etch having a high selective etch rate of oxide to silicon is used to avoid eroding the silicon substrate. For example, reactive ion etching using an etch gas mixture, such as carbon tetrafluoride ($CF_4$) and hydrogen ($H_2$) or alternatively a trifluormethane ($CHF_3$) in a carrier gas, such as argon (Ar), can be used.

Figure 5:
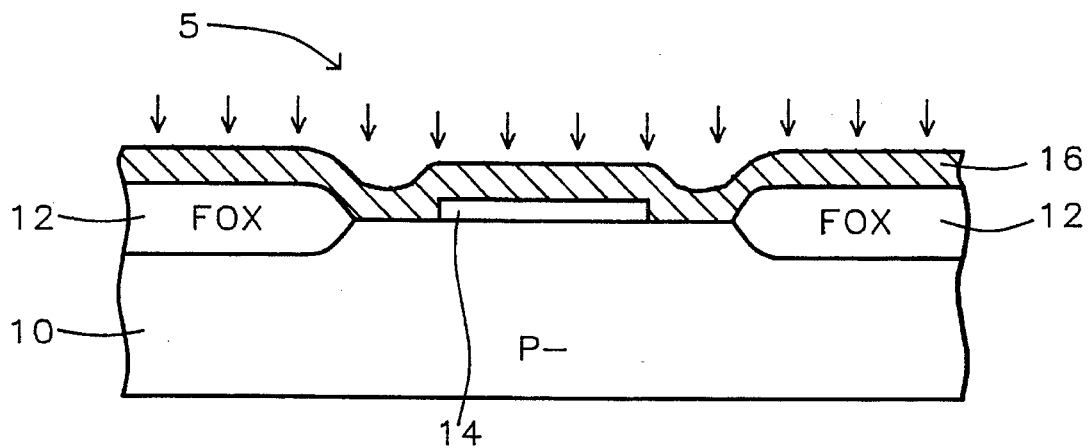

A first polysilicon layer 16 is now deposited over the pad oxide layer 14, as shown in FIG. 5. The polysilicon layer 16 is preferably deposited at a relatively low temperature. For example, the polysilicon can be deposited by conventional methods, such as low pressure chemical vapor deposition (LPCVD) using for example a reactant gas such as silane ($SiH_4$) and at a deposition a temperature of about 600° C. The thickness of the first polysilicon layer 16 is preferably in the range of between about 1000 to 2000 Angstroms. The layer 16 in then doped with a second conducting type dopant of the N type, such as arsenic (As) or phosphorus (P) by ion implantation, as depicted in FIG. 5 by the vertical arrows 5. Alternatively, the polysilicon layer 16 can be doped in situ during the polysilicon deposition by, for example, adding phosphine ($PH_3$) or arsine ($AsH_3$) to the silane gas. The preferred N dopant concentration in layer 16 is between about 1.0 E 20 to 2.0 E 21 atoms/cm$^3$. This layer will eventually form the polysilicon source/drain pads for the FET from which the N-type dopant will be diffused into the substrate 10 to form shallow source/drain junctions.

Figure 6:
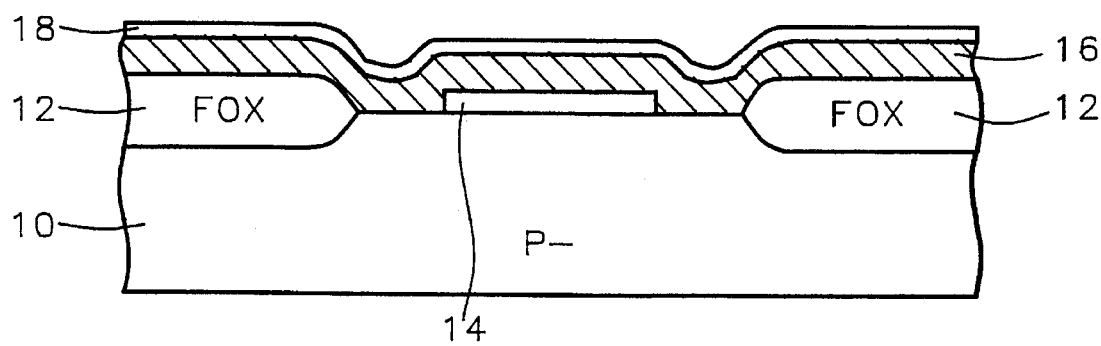

Referring now to FIG. 6, a first insulating layer 18 is deposited over the N doped polysilicon layer 16. The layer 18 serves as an inter-polysilicon oxide (IPO) layer to electrically isolate the source/drain polysilicon layer from the gate electrode that is formed at a later step. The insulating layer 18, for example, can be composed of silicon oxide, and can be deposited at a relatively low temperature by atmospheric pressure chemical vapor deposition (APCVD) or alternatively by plasma enhanced CVD (PECVD). The oxide is preferably deposited in a PECVD deposition system using a gas mixture of silane ($SiH_4$) and nitrous oxide ($N_2O$) or $SiH_4$ and oxygen ($O_2$) at a deposition temperature of between about 300° to 400° C. The preferred thickness of layer 18 is between about 500 to 800 Angstroms.

Figure 7:
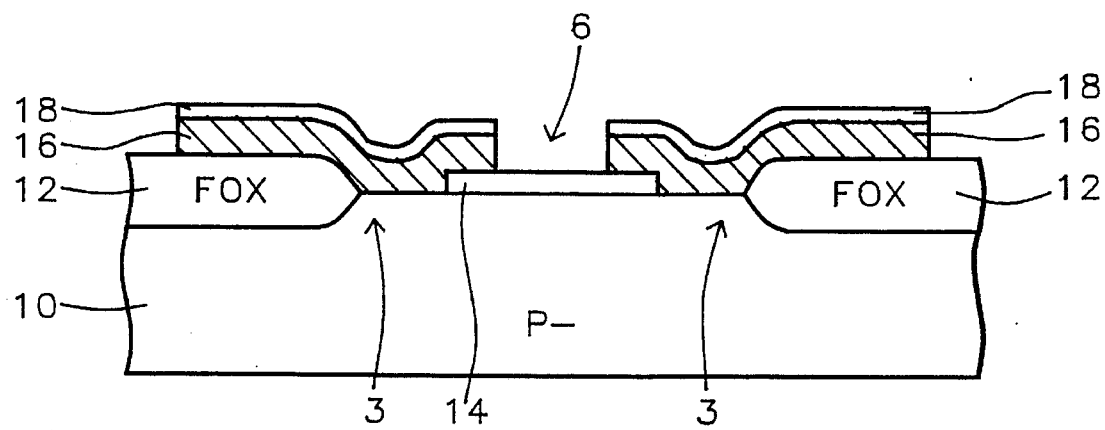

Now as shown in FIGS. 7, conventional photolithographic techniques and anisotropic plasma etching are used to pattern layers 18 and 16 forming portions of polysilicon layer 16 over the source and the drain areas 3, that also overlap the field oxide areas 12 and furthermore, form a narrow opening 6 extending over the pad oxide layer 14. The patterning forming two separate and electrically isolated portions of polysilicon layer 16 into two portions for the source and drain areas. The opening 6 having essentially vertical sidewalls will later serve as the sub-quarter micrometer channel region for the FET. The FIGS. 7 depicting only one of the many device areas having an opening 6 after the plasma etching and removal of the photoresist mask. The anisotropic etching, for example, can be performed in a reactive ion etcher or also in a high plasma density etcher having a microwave or transformer coupled plasmas sources. The silicon oxide layer 18 is preferably etched in a etch gas mixture containing fluorine, such as carbon tetrafluoride ($CF_4$) while the polysilicon layer 16 is etched using a gas mixture containing chlorine ($Cl_2$).

The doped pad oxide layer 14 provides an important functions in the invention as an etch stop layer, so as to prevent etching into the silicon substrate 10 when the polysilicon layer 16 is patterned and the opening 6 is etched in the polysilicon layer 16 over the device area.

Figure 8:
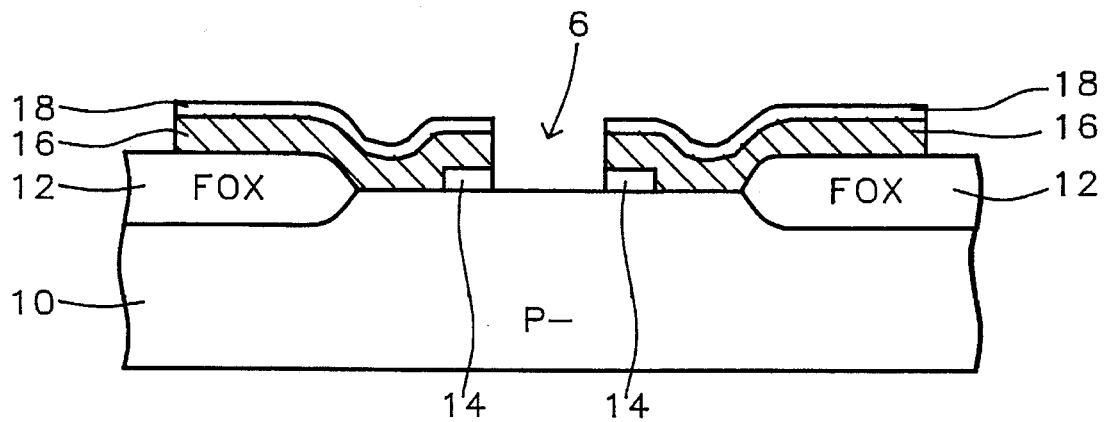

Now as shown in FIG. 8, after the doped pad oxide layer 14 has served its purpose as an etch stop layer for etching the polysilicon layer in opening 6, it is selectively and anisotropically etched from the surface of substrate 10 in the opening 6 by etching in a plasma etcher having a high etch selectivity of oxide to silicon, as was previously described and depicted in FIG. 4. for patterning the pad oxide 14.

Figure 9:
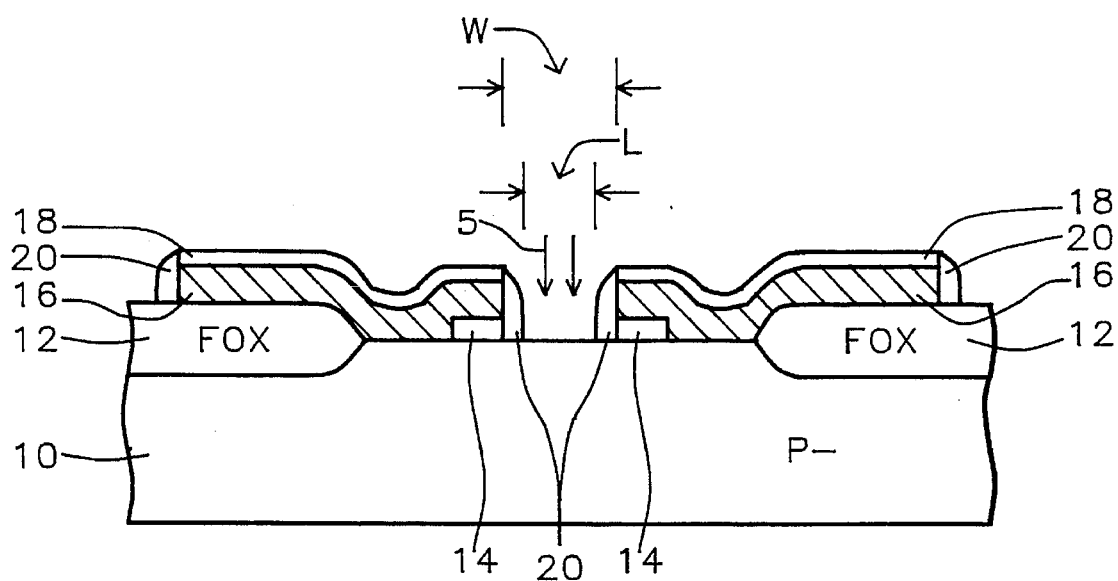

Referring next to FIG. 9, sidewall spacers 20 are formed on the vertical sidewalls of the patterned layers 14, 16 and 18 and provide the important function in opening 6 of reducing the opening 6 to sub-quarter micrometer dimensions. The sidewall spacers 20 are formed by depositing a conformal second insulating layer (not shown in FIG. 8) over the first insulating layer 18, in the opening 6, and elsewhere on the structure of FIG. 8, (the second insulating layer is also not shown in the FIG. 9 only the resultant sidewall spacer 20 are shown). The second insulating layer is then anisotropically blanket etched back to the first insulating layer 18 to form the spacers 20, as shown in FIG. 9. The second insulating layer is preferably composed of a silicon oxide ($SiO_2$) or alternatively of silicon nitride ($Si_3N_4$). The method of choice for depositing the silicon oxide is by low pressure CVD using, for example, tetraethosiloxane (TEOS) as the reactant gas and the preferred method for depositing silicon nitride is in a LPCVD reactor using, for example dichlorosilane ($SiCl_2H_2$) and ammonia ($NH_3$) as reactant gas.

The sidewall spacers 20 provides an important function in the invention because they reducing the width of the opening 6, and thereby effectively extend the resolution limit of the current photolithographic technology. By way of example, if the resolution of the photoresist image and plasma etching can reliably form an opening having a width W of about 0.25 micrometers (um) in the polysilicon layer 16, then by forming sidewalls having a width of 0.075 micrometers the opening between the sidewalls is reduced in size to a width L of about 0.1 micrometers, as depicted in FIG. 9. Therefore, since it is easier to control the deposition thickness of the second insulating layer it is ease to accurately reduce the opening 6 to form the sub-quarter micrometer channel length. As a second example, if the opening 6 is designed to be 0.45 um, then sidewall spacer formed from the second insulating layer having a thickness of about 1000 Angstroms (0.1 um) would result in a channel opening of about 0.25 um. Similar examples can be given for other desired sub-0.25 um opening sizes.

Still referring to FIG. 9, a dopant of the first conductive dopant type, for example, boron difluoride ions ($BF_2^+$) is implanted in the channel opening 7 to adjust the threshold voltage ($V_{th}$) of the N-channel FET described this embodiment. The implant is also depicted in FIG. 9 as vertical arrows labeled 5. The implant dose and energy are determined by the device design characteristic for the specific circuit design, such as the required threshold voltage ($V_{th}$), substrate dopant level, gate oxide thickness and gate electrode material. At this step a buried anti-punchthrough implant (not depicted in the FIG. 9), such as $B^{11}$, can also be include to provide punch-through immunity between source and drain, if required.

A thin gate oxide 24 is next formed on the substrate 10 surface in the channel openings 8 between the sidewall spacers 20. The oxide is preferably formed by thermal oxidation in a dry oxidizing ambient such as oxygen ($O_2$). The preferred thickness of the gate oxide 24 is between about 50 to 80 Angstroms.

Figure 10:
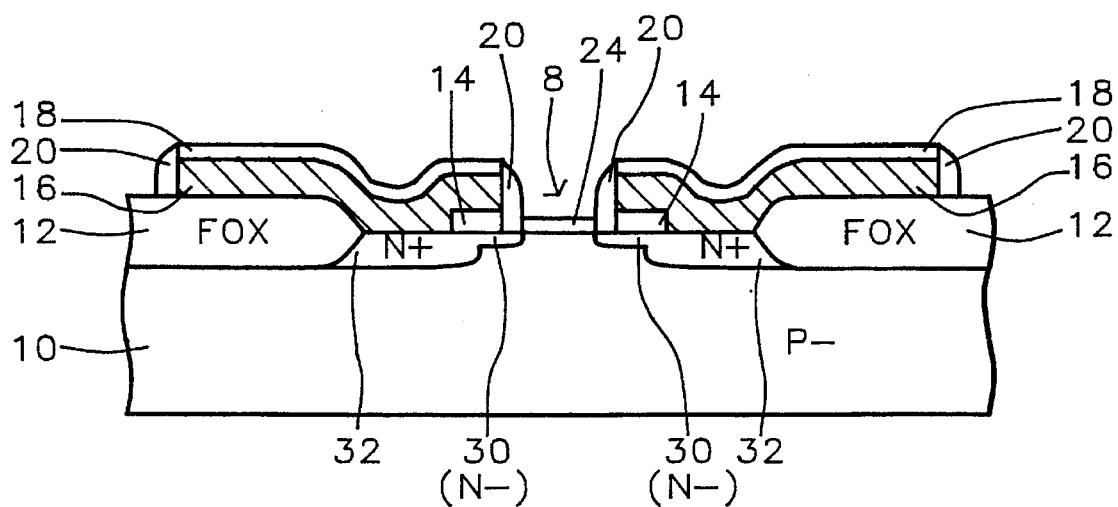

The shallow diffused junctions are formed next. The substrate 10 is heated and the dopant is thereby out diffused from the patterned first polysilicon layer 16. This dopant of the second conductive type forms shallow source/drain regions 32, in the P⁻ substrate, as shown in FIG. 10. The source/drain contact areas have a high N⁺ dopant concentration, formed from the second conducting type dopant, such as phosphorus (P) or arsenic (As). The heat budge (temperature and time) are preferably chosen to provide a junction depth ($x_j$) of between about 0.10 to 0.15 micrometers below the substrate surface. Simultaneously, a low doped N⁻ region 30 is formed in the substrate 10, adjacent to the channel opening, by out-diffusion of phosphorus from the doped pad oxide areas, thereby forming shallow lightly doped source/drain areas 30, also depicted in FIG. 10. The shallow lightly doped drain on the short channel length field effect transistor significantly reduces the undesirable short channel effects. The lightly doped source/drain areas also diffuse laterally under the sidewall spacers 20, thereby completing the substrate diffused part of the reverse self-aligned FET structure.

The drive-in conditions for forming the shallow source/drain junctions is a 15 to 30 minute heating cycle at a temperature of between about 850° to 900° C. in an inert ambient such as nitrogen ($N_2$).

Figure 11:
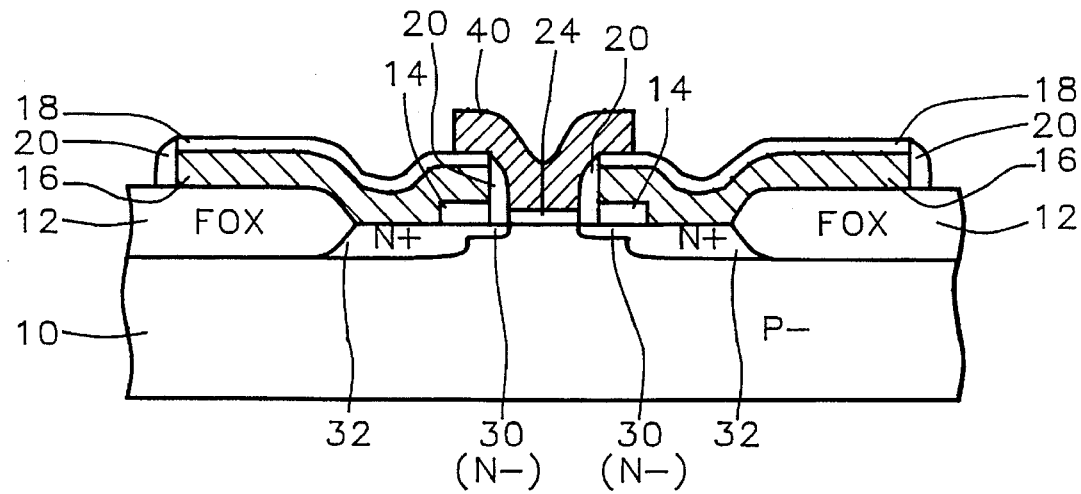

Referring next to FIG. 11, a second polysilicon layer 40 is deposited by chemical vapor deposition (CVD) means similar to the deposition of the first polysilicon layer 16. The layer is then doped with a dopant of the second conductive type, such as arsenic or phosphorus. The dopant is introduced into layer 40 either by ion implantation or in situ doping during deposition. The preferred dopant type is arsenic (As) and the preferred implant dose in layer 40 is between about 5.0 E 15 to 1 E 16 atoms/cm². The preferred thickness of layer 40 is between about 1500 to 2500 Angstroms.

The polysilicon layer 40 is then patterned by conventional photolithographic means and plasma etching to form the self-aligned overlapping gate electrode, also labeled 40 in FIG. 11. The gate electrode is formed over and in the sub-quarter micrometer wide FET channel under the gate oxide 24, as shown in FIG. 11.

Figure 12:
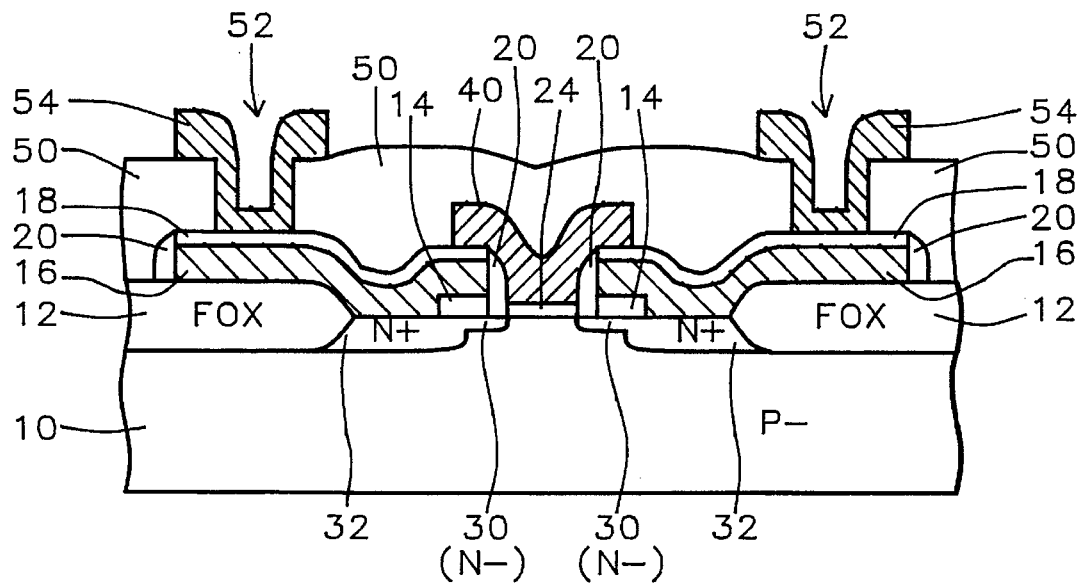

Referring now to FIG. 12, a third insulating layer 50 is deposited over the substrate having the gate electrode structure 40 and the elevated source/drain structures 16. The layer 50 is preferably composed of a CVD silicon oxide or a borophosphosilicate glass (BPSG) having a thickness of between about 6000 to 8000 Angstroms. Source/drain contact openings 52, are etched in the third and first insulating layers 50 and 18 to the patterned first polysilicon layer 16 forming the raised portions of the source/drain areas. A conducting layer 54 is deposited over layer 50 and in the contact openings 52. Layer 54, for example, can be composed of a polysilicon/metal silicide, tungsten (W), aluminium and similar conducting materials. The conducting layer 54 is then patterned by photoresist masking and etching to from contact metal pads 54, and thereby completing the reverse self-aligned FET structure having sub quarter micrometer channel lengths and source/drain contacts.

While the invention has been particularly shown and described with reference to the preferred embodiments thereof, it will be understood by those skilled in the art that various changes in form and details may be made without departing from the spirit and scope of the invention. For example, by reversing the polarity of the first and second conductive type dopants and appropriately selecting the dopant concentrations, it is possible to fabricate a P⁻ channel FET by the same invention.

What is claimed is:

1. A reverse self-aligned field effect transistors with lightly doped drains, comprising of:

a semiconductor substrate doped with a first conductive type dopant;

field oxide areas on said semiconductor substrate around and electrically isolating device areas;

a patterned doped pad oxide layer on said substrate with a second conductive type dopant, portions of said doped pad oxide over part of each of said device areas and leaving parts of each of said device areas free of said pad oxide for source/drain junction openings;

said patterned doped pad oxide layer extending also over portions of said field oxide areas on opposite sides of said device areas;

a patterned first polysilicon layer with a first insulating layer on the surface, portions of said first polysilicon layer over said patterned doped pad oxide layer and over said source/drain junction openings, said first polysilicon layer doped with a second conductive type dopant;

said patterned first insulating layer and said first polysilicon layer and said doped pad oxide layer having channel openings with vertical walls to said device areas on said substrate;

sidewall spacers on said vertical sidewalls in said channel openings, and thereby having reduced channel opening widths;

an ion implant dopant in said device areas within said channel opening of said first conductive type;

a gate oxide on the surface of said device areas in said channel openings;

doped source/drain areas in portions of said device areas resulting from heating and out diffusion from said first polysilicon layer of said second conductive type dopant; and lightly doped source/drain areas adjacent to said channel openings resulting simultaneously from out diffusion from said patterned doped pad oxide layer of said second conductive type dopant during said heating;

a patterned conformal second polysilicon layer over said channel openings having said second conductive type dopant and thereby providing an overlapping FET gate electrode;

a third insulating layer over said overlapping gate electrodes and over said first insulating layer, said third and first insulating layers having contact openings to said first polysilicon layer, and thereby providing contact openings to said source/drain areas;

a patterned conducting layer on said third insulating layer and in said contact openings and thereby comprising said reverse self-aligned field effect transistors with said overlapping gate electrodes, source/drain areas and conducting layer contacts.

2. The field effect transistor of claim 1, wherein said doped pad oxide layer is composed of a doped silicate glass having a thickness of between about 100 to 300 Angstroms.

3. The field effect transistor of claim 1, wherein said doped pad oxide layer is an etch stop layer for etching said channel opening in said first polysilicon layer.

4. The field effect transistor of claim 1, wherein the thickness of said first polysilicon layer is between about 1000 to 2000 Angstroms.

5. The field effect transistor of claim 1, wherein said doped source/drain areas in said device areas have junction depths of between about 0.10 to 0.15 micrometer.

6. The field effect transistor of claim 1, wherein said lightly doped source/drain areas in said device areas have a junction depth of between about 0.0.05 to 0.08 micrometer.

7. The field effect transistor of claim 1, wherein the lateral length of said lightly doped source/drain areas adjacent to said channel opening are between about 0.10 to 0.15 micrometers.

8. The field effect transistor of claim 1, wherein the channel length is between about 0.10 to 0.25 micrometers.

9. The field effect transistor of claim 1, wherein said first conductive type dopant is boron (B) and the second conductive type dopant is phosphorus (P), and said reverse self-aligned field effect transistor is an N-channel FET.

10. The field effect transistor of claim 1, wherein said first conductive type dopant is arsenic (As) and said second conductive type dopant is boron (B), and said reverse self-aligned field effect transistor is a P-channel FET.

* * * * *